United States Patent
Baek et al.

(10) Patent No.: US 7,602,223 B2
(45) Date of Patent: Oct. 13, 2009

(54) DELAY-LOCKED LOOP CIRCUIT AND METHOD OF GENERATING MULTIPLIED CLOCK THEREFROM

(75) Inventors: Seung-Hwan Baek, Anyang-si (KR); Seung-Won Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/877,187

(22) Filed: Oct. 23, 2007

(65) Prior Publication Data

US 2008/0116950 A1 May 22, 2008

(30) Foreign Application Priority Data

Nov. 21, 2006 (KR) .................. 10-2006-115383

(51) Int. Cl.
*H03L 7/06* (2006.01)
(52) U.S. Cl. .................. 327/158; 327/155; 327/156; 327/161
(58) Field of Classification Search .................. 327/116, 327/141, 144–163; 331/1 A, 15–17; 375/373–376
See application file for complete search history.

(56) References Cited

U.S. PATENT DOCUMENTS

| | | | |
|---|---|---|---|
| 5,712,884 A * | 1/1998 | Jeong | 375/375 |
| 6,100,735 A | 8/2000 | Lu | |
| 6,191,623 B1 * | 2/2001 | Gabara | 327/71 |
| 6,727,737 B2 | 4/2004 | Trivedi et al. | |
| 6,806,786 B1 * | 10/2004 | Lam et al. | 331/179 |
| 7,375,564 B2 * | 5/2008 | Cho et al. | 327/158 |
| 2003/0169085 A1 * | 9/2003 | Partsch et al. | 327/158 |
| 2003/0223510 A1 * | 12/2003 | Kurakami et al. | 375/297 |
| 2004/0008063 A1 * | 1/2004 | Kim et al. | 327/158 |

FOREIGN PATENT DOCUMENTS

| | | |
|---|---|---|
| KR | 1020000077451 A | 12/2000 |
| KR | 1020010035839 A | 5/2001 |
| KR | 1020050011586 A | 1/2005 |
| KR | 1020050032827 A | 4/2005 |
| KR | 1020050134337 A | 7/2007 |

* cited by examiner

*Primary Examiner*—Lincoln Donovan
*Assistant Examiner*—Brandon S Cole
(74) *Attorney, Agent, or Firm*—F. Chau & Associates, LLC

(57) ABSTRACT

A delay-locked loop circuit includes: a phase detector generating a detection signal from a phase difference between an external clock signal and a feedback clock signal; a charge pump controlling a level of a voltage signal in response to the detection signal; and a voltage-controlled delay line generating a plurality of delay clock signals by delaying the external clock signal in response to the voltage signal and generating a multiplied clock signal using the delay clock signals in different numbers in accordance with a frequency domain of the external clock signal. The multiplied clock signal is generated by multiplying the external clock signal an integer number of times and the feedback clock signal is delayed from the plurality of delay clock signals by a cycle period of the external clock signal.

7 Claims, 8 Drawing Sheets

DELAY-LOCKED LOOP CIRCUIT AND METHOD OF GENERATING MULTIPLIED CLOCK THEREFROM

CROSS-REFERENCE TO RELATED APPLICATION

This U.S. non-provisional patent application claims priority under 35 U.S.C. § 119 of Korean Patent Application No. 2006-115383 filed on Nov. 21, 2006, the entire contents of which are incorporated herein by reference.

BACKGROUND

The present disclosure relates to semiconductor integrated circuits and, more particularly, to a delay-locked loop (DLL) circuit and a method for generating a multiplied clock therefrom.

DLL circuits are typically used for providing internal clock signals preceding reference clock signals by a predetermined time. Internal clock signals are generally necessary for highly integrated semiconductor circuits, such as Rambus DRAMs or Synchronous DRAMs, which operate in sync with external clock signals corresponding to reference clock signals.

An external clock signal introduced through an input pin is put into a clock buffer. The clock buffer generates an internal clock signal. The internal clock signal controls a data output buffer to output data to an external device. During this operation, the internal clock signal is delayed from the external clock signal in a predetermined time through the clock buffer. The output data from the data output buffer is thereby output after a delay from the internal clock signal by a predetermined time.

Because of that, there is a problem that the output data is output after too long a time following an input of the external clock signal. In other words, it lengthens an output data access time tAC, which is a time for outputting data following an input of an external clock signal.

For the purpose of overcoming the problem of output lateness, a DLL circuit is employed to make an internal clock signal precede a reference clock signal, that is, an external clock signal, in phase by a predetermined time, so that data can be output without a delay from the external clock signal. The DLL circuit receives the external clock signal and then generates the internal clock signal earlier in phase by a predetermined time. The internal clock signal is used in each unit or block, such an internal buffer.

A conventional DLL circuit operates to determine the length of a delay time by means of a voltage signal. For that reason, there is an operational burden that the voltage signal is needed to swing in a large range in order to support a wide range of operating frequencies. Furthermore, with a low driving voltage, there is less change in linearity of an operating frequency along with the voltage signal.

SUMMARY OF THE INVENTION

Exemplary embodiments of the present invention are provided to overcome the aforementioned problems. Exemplary embodiments of the present invention provide a DLL circuit operable in a wide range of operating frequencies, even with a small change of a voltage signal and a low driving voltage, as well as a method for generating a multiplied clock therefrom.

An exemplary embodiment of the present invention is a delay-locked loop circuit comprised of: a phase detector generating a detection signal from a phase difference between an external clock signal and a feedback clock signal; a charge pump controlling a level of a voltage signal VCON in response to the detection signal; and a voltage-controlled delay line generating a plurality of delay clock signals by delaying the external clock signal in response to the voltage signal and generating a multiplied clock signal by means of the delay clock signals different in number in accordance with a frequency domain of the external clock signal. The multiplied clock signal is generated by multiplying the external clock signal by an integer number of times and the feedback clock signal is delayed from the plurality of delay clock signals by a cycle period of the external clock signals.

In an exemplary embodiment, the frequency domain is divided into high and low frequency domains relative to a reference frequency.

In an exemplary embodiment, the delay-locked loop circuit is further comprised of a frequency detector generating a selection signal dividing the high and low frequency domains in response to the external clock signal. The voltage-controlled delay line generates the multiplied clock signal in response to the selection signal.

In an exemplary embodiment, the detection signal of the phase detector includes up and down signals.

According to an exemplary embodiment, the phase detector is comprised of a first flip flop including an input node to which a driving voltage is applied, a clock node to which the external clock signal is applied, a reset node to which a reset signal is applied, and an output node from which the up signal is output; a second flip flop including an input node to which a driving voltage is applied, a clock node to which the feedback clock signal is applied, a reset node to which the reset signal is applied, and an output node from which the down signal is output; a first logic circuit executing a NAND operation with the up and down signals; and a second logic circuit generating the reset signal from an AND operation with an output value of the first logic circuit and an initializing signal.

In an exemplary embodiment, the charge pump is comprised of: a first NMOS transistor including a drain connected to a driving voltage, a source connected to an output terminal, and a gate coupled to the up signal; a second NMOS transistor including a drain connected to the output terminal, a source connected to a ground, and a gate coupled to the down signal; and a capacitor coupled between the output terminal and the ground.

In an exemplary embodiment, the voltage-controlled delay line generates the plurality of delay clock signal by way of a plurality of delay cells.

In an exemplary embodiment, the delay cell generates the delay clock signal from an input clock signal through an inverter.

According to an exemplary embodiment, the delay cell is comprised of: a PMOS transistor including a source connected to the driving voltage, a drain connected to a delay clock signal output node, and a gate coupled to an input clock signal; a third NMOS transistor including a drain connected to the delay clock signal output node and a gate coupled to the input clock signal; and a fourth NMOS transistor including a drain connected to the source of the third NMOS transistor, a source connected to a ground, and a gate coupled to the voltage signal.

In an exemplary embodiment, the voltage-controlled delay line is comprised of 2m delay cells, where m is a positive integer that sequentially generates 2m delay clock signals with predetermined delay times, and determines to generate the multiplied clock signal by means of the delay clock signals of either m or 2m in number, according to a delayed sequence, in response to the selection signal.

According to an exemplary embodiment, the m delay clock signals are used when the external clock operates at a high frequency, and the 2m delay clock signals are used when the external clock signal operates at a low frequency.

In an exemplary embodiment, the voltage-controlled delay line is comprised of: a first multiplied clock generator operating to generate a first multiplied clock signal by means of the m-numbered delay clock signals sequentially delayed from the external clock signal; a second multiplied clock generator operating to generate a second multiplied clock by means of the 2m-numbered delay clock signals; and a multiplied clock selector operating to select an alternative one from the first and second multiplied clock signals in response to the selection signal.

In an exemplary embodiment, the voltage-controlled delay line is further comprised of buffers temporarily storing the 2m-numbered delay clock signals. The delay clock signals stored in the buffers are transferred to the first and second multiplied clock generators.

In an exemplary embodiment, the first and second multiplied clock generators operate to generate the multiplied clock signal that is a half of the external clock signal in cycle period.

In an exemplary embodiment, m is 4 and the delay clock signals are generated from first to eighth in sequence.

According to an exemplary embodiment, the first multiplied clock generator is comprised of: a first logic circuit executing an XOR operation with the first and second delay clock signals; a second logic circuit executing an XOR operation with the third and fourth delay clock signals; and a third logic circuit generating the first multiplied clock signal by executing an XOR operation with output values of the first and second logic circuits.

According to an exemplary embodiment, the second multiplied clock generator is comprised of: a fourth logic circuit executing an XOR operation with the fifth and sixth delay clock signals; a fifth logic circuit executing an XOR operation with the seventh and eighth delay clock signals; a sixth logic circuit executing an XOR operation with output values of the fourth and fifth logic circuits; a seventh logic circuit executing an XOR operation with output values of the first multiplied clock generator and the sixth logic circuit; and a frequency divider generating the second multiplied clock signal by dividing an output value of the seventh logic circuit in half.

In an exemplary embodiment, the voltage-controlled delay line is further comprised of a feedback clock selector operating to select an alternative one from the fourth and eighth delay clock signals in response to the selection signal.

Exemplary embodiments of the present invention also provide a delay-locked loop circuit comprised of: a phase detector generating a detection signal from a phase difference between an external clock signal and a feedback clock signal; a charge pump controlling a level of a voltage signal VCON in response to the detection signal; a selection signal generator operating to generate a selection signal, according to a plurality of frequency domains, in response to the detection signal; and a voltage-controlled delay line generating a plurality of delay clock signals by delaying the external clock signal in response to the voltage signal and generating a multiplied clock signal, which is multiplied from the external clock signal by an integer number of times, from the delay clock signals in different number in accordance with the selection signal. The feedback clock signal is delayed from the plural delay clock signals by a cycle period of the external clock signal.

Another exemplary embodiment of the present invention is a method of generating a multiplied clock signal from a delay-locked loop circuit, including the steps of: (a) detecting a frequency domain of an external clock signal; and (b) generating a multiplied clock signal with a varying number of delay cells in accordance with the frequency domain detected by the step (a).

In an exemplary embodiment, the frequency domain is divided into high and low frequency domains on a reference frequency and the multiplied clock is a half of the external clock in cycle period.

In an exemplary embodiment, the multiplied clock signal is generated from half of the delay cells when the external clock signal operates at a high frequency, and the multiplied clock is generated from all of the delay cells when the external clock operates at a low frequency.

A further understanding of the nature and advantages of exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the attached figures, wherein like reference numerals refer to like parts throughout the various figures unless otherwise specified. In the figures.

DETAILED DESCRIPTION OF EXEMPLARY EMBODIMENTS

Figure 1:
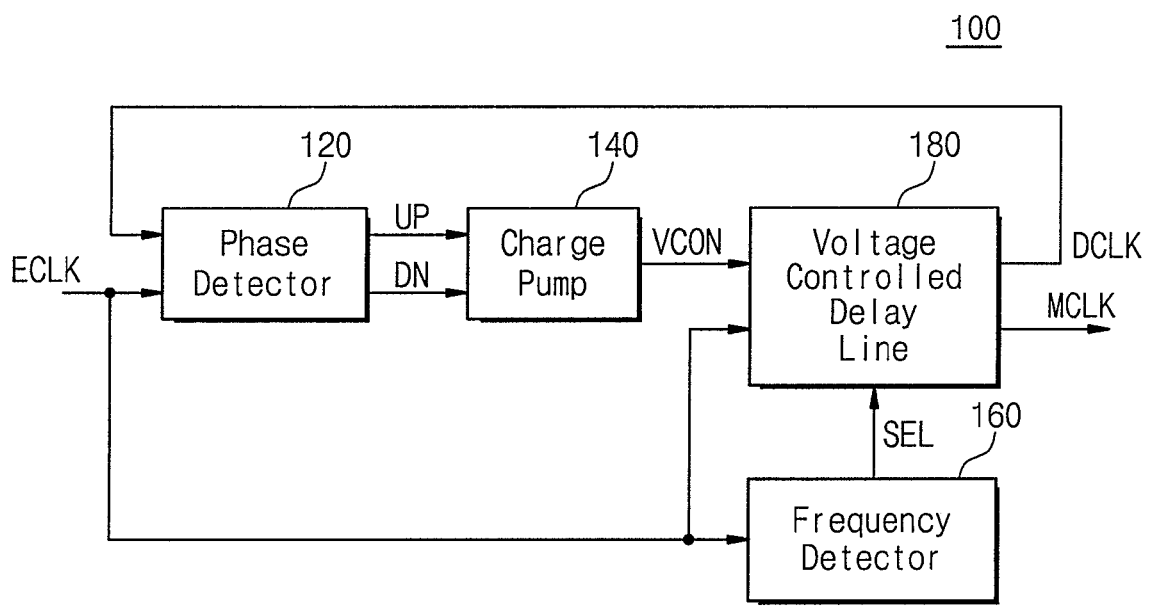
FIG. 1 is a block diagram of a DLL circuit according to an exemplary embodiment of the present invention.

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

FIG. 1 is a block diagram of a DLL circuit 100 according to an exemplary embodiment of the present invention. Referring to FIG. 1, the DLL circuit 100 is comprised of a phase detector 120, a charge pump 140, a frequency detector 160, and a voltage-controlled delay line 180. The DLL circuit 100 operates differently dependent on the frequency detected by the frequency detector 160, which will be described in detail with reference to FIG. 5 hereinbelow.

The phase detector 120 compares the phase of an external clock signal ECLK with the phase of a delay clock signal, or feedback clock signal, DCLK of the DLL circuit outputs a result of the phase comparison as a detection signal.

Figure 2:
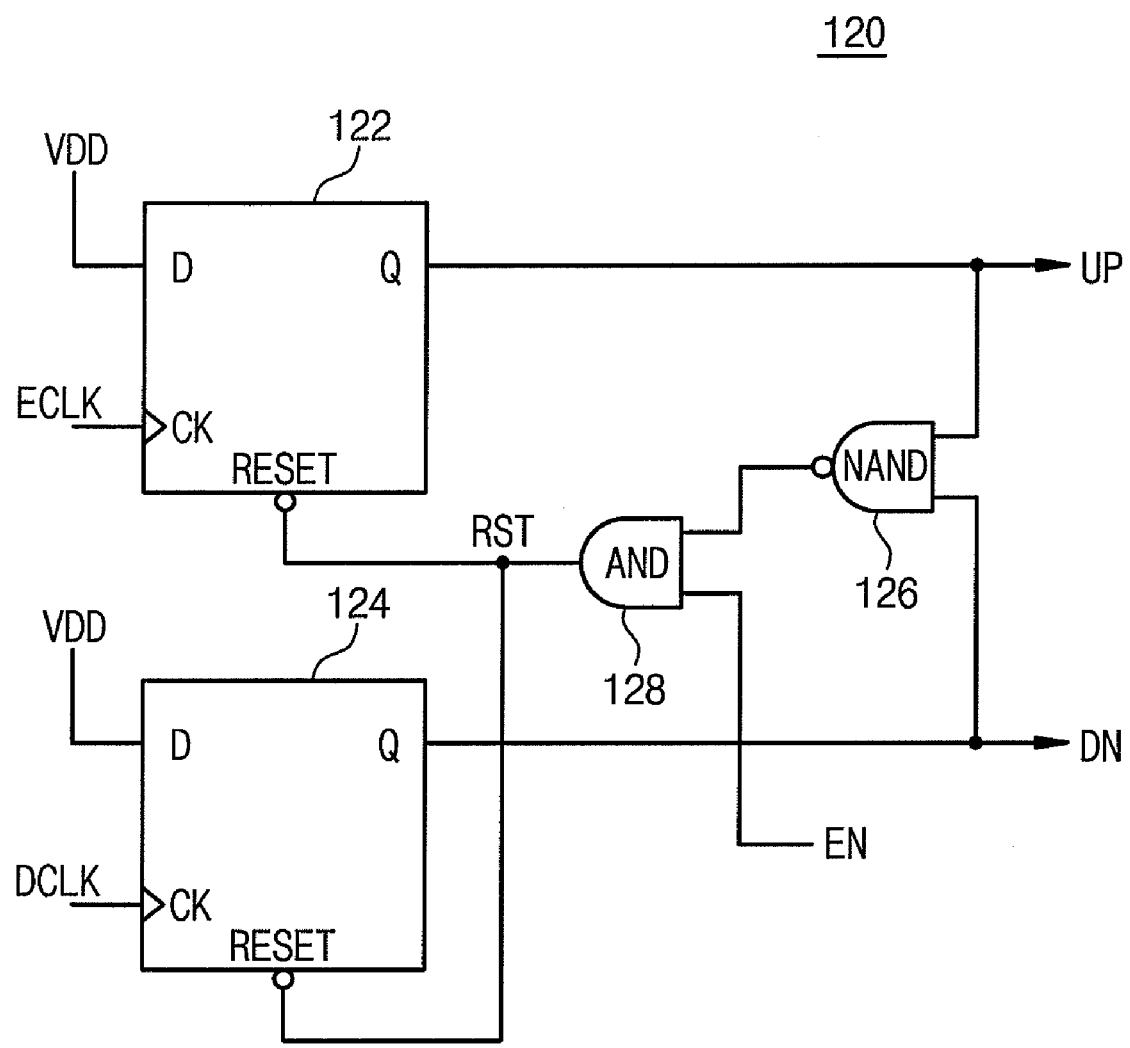
FIG. 2 is a circuit diagram of a phase detector according to an exemplary embodiment of the present invention.

Referring to FIG. 2, the phase detector 120 includes a first flip flop 122, a second flip flop 124, a NAND circuit 126, and an AND circuit 128. The first flip flop 122 includes an input node D to which a driving voltage VDD is applied, a clock node CK to which the external clock signal ECLK is applied, a reset node RESET to which a reset signal RST is applied, and an output node Q from which a detection signal, or up signal, UP is output. The second flip flop 124 includes an input node D to which the driving voltage VDD is applied, a clock node CK to which the delay or feedback clock signal DCLK is applied, a reset node RESET to which a reset signal RST is applied, and an output node Q from which a detection signal, or down signal, DN is output. The NAND circuit 126 executes a NAND operation with the detection signals UP and DN. The AND circuit 128 executes an AND operation with an output signal of the NAND circuit 126 and an initializing signal EN, and outputs the reset signal RST.

Figure 3:
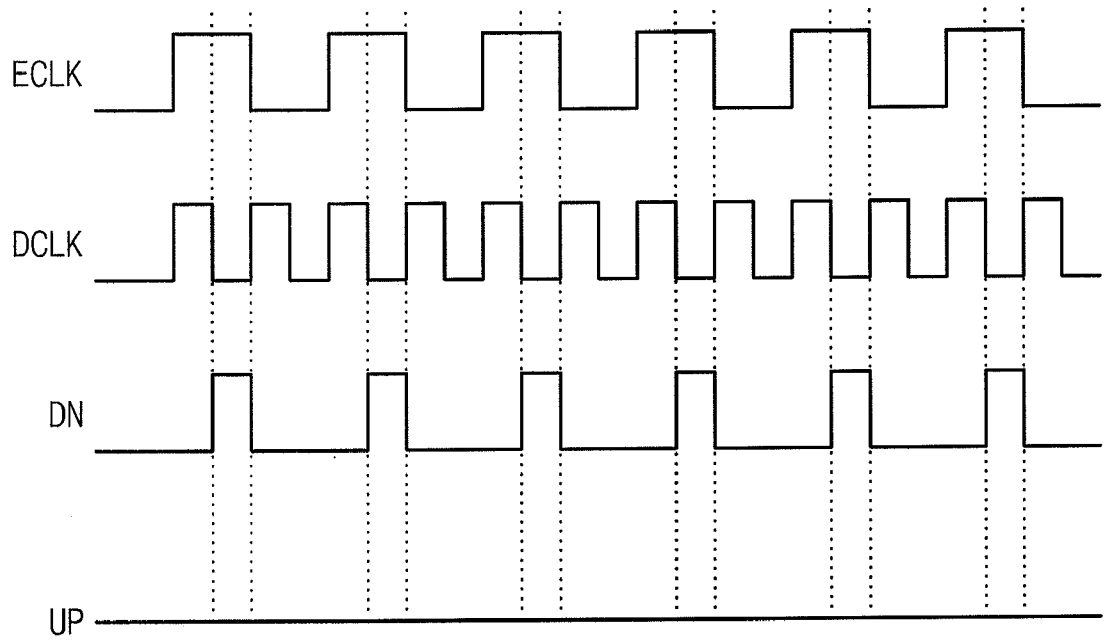
FIG. 3 is a timing diagram showing an operation of the phase detector shown in FIG. 2.

FIG. 3 is a timing diagram showing an operation of the phase detector 120. Referring to FIG. 3, the delay clock signal DCLK has a shorter cycle period than the external clock signal ECLK. When the delay clock signal DCLK and the external clock signal ECLK are input to the phase detector 120, the phase detector 120 turns the detection signal DN to a high level and the detection signal UP to a low level, and the high and low-level detection signals UP and DN are fed to the charge pump 140.

Figure 4:
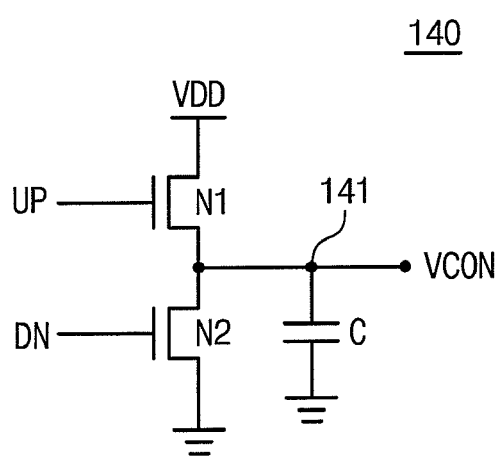
FIG. 4 is a circuit diagram of a charge pump according to an exemplary embodiment of the present invention.

The charge pump 140 controls a voltage signal VCON in response to the detection signals UP and DN transferred from the phase detector 120. FIG. 4 is a circuit diagram of the charge pump 140 according to an exemplary embodiment of the present invention. Referring to FIG. 4, the charge pump 140 includes NMOS transistors N1 and N2 and a capacitor C.

The first NMOS transistor N1 has a drain connected to the driving voltage VDD, a source connected to an output terminal 141, and a gate coupled to the detection signal UP. The second NMOS transistor N2 has a drain connected to the output terminal 141, a source connected to the ground, and a gate coupled to the detection signal DN. The capacitor C is coupled between the output terminal 141 and the ground. The voltage signal VCON corresponds to a voltage level of the output terminal 141.

Referring to FIG. 4, the charge pump 140 operates as follows. If the detection signal UP is a high level, the first NMOS transistor N1 is turned on to store charges in the capacitor C. Thus, the voltage VCON of the output terminal 141 rises up. On the other hand, if the detection signal DN is a high level, the second NMOS transistor N2 is turned on to discharge the charges from the capacitor C to the ground. Then, the voltage VCON of the output terminal 141 drops. The voltage VCON, as an output of the charge pump 140, is transferred to the voltage-controlled delay line 180.

Figure 9:
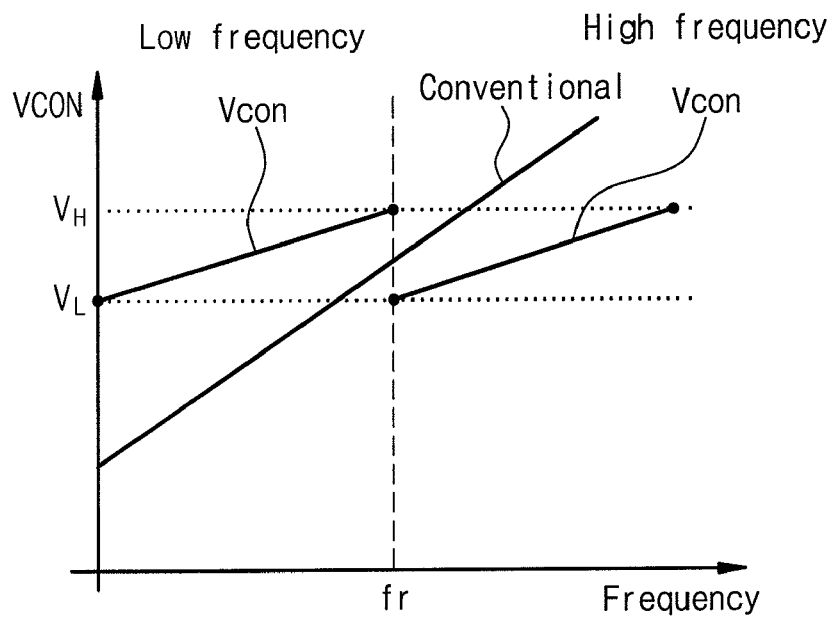
FIG. 9 is a graphic diagram showing level variation of a voltage signal along an input frequency in the voltage-controlled delay line.

The frequency detector 160 generates a selection signal SEL by comparing the external clock signal ECLK to an internal reference frequency fr. The reference frequency fr is fixed to a single frequency in this exemplary embodiment and is shown in FIG. 9. For instance, in this exemplary embodiment, it is assumed that the reference frequency is 400 MHz.

If the external clock is over 400 MHz, the frequency detector 160 outputs the selection signal SEL at a high level. If the external clock is under 400 MHz, the frequency detector 160 outputs the selection signal SEL at a low level. The selection signal SEL from the frequency detector 160 is transferred to the voltage-controlled delay line 180.

Figure 10:
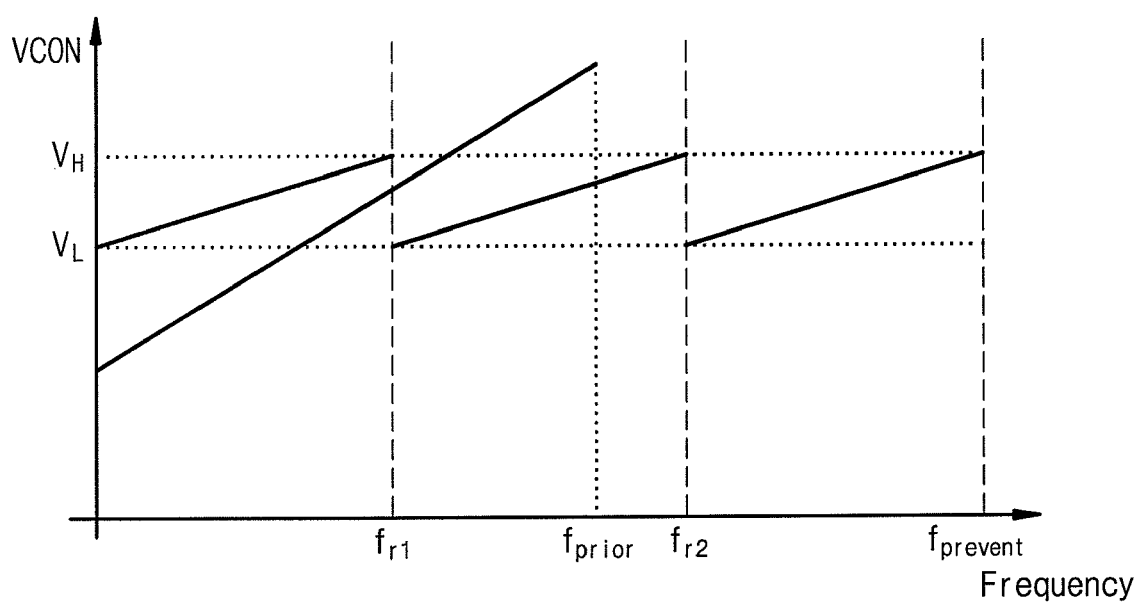
FIG. 10 is a graphic diagram showing level variation of a voltage signal along an input frequency in the voltage-controller delay line operating by three frequency domains.

The frequency detector 160 may be operable for two or more reference frequencies as shown in FIG. 10. Thus, a plurality of selection signals SEL can be generated in the intervals between the different reference frequencies and then transferred to the voltage-controlled delay line 180.

The voltage-controlled delay line 160 receives the external clock signal ECLK and generates the delay clock signal DCLK and a multiplied clock signal MCLK. In this exemplary embodiment, the delay clock signal DCLK is is generated by delaying the external clock signal ECLK, and the multiplied clock signal MCLK is generated by multiplying the external clock signal ECLK an integer number of times. The voltage-controlled delay line 160 according to an exemplary embodiment of the present invention operates dependent on frequency. More specifically, there is a difference in operation between when a frequency of the external clock signal ECLK is higher than the reference frequency and when the frequency of the external clock signal ECLK is lower than the reference frequency.

Figure 5:
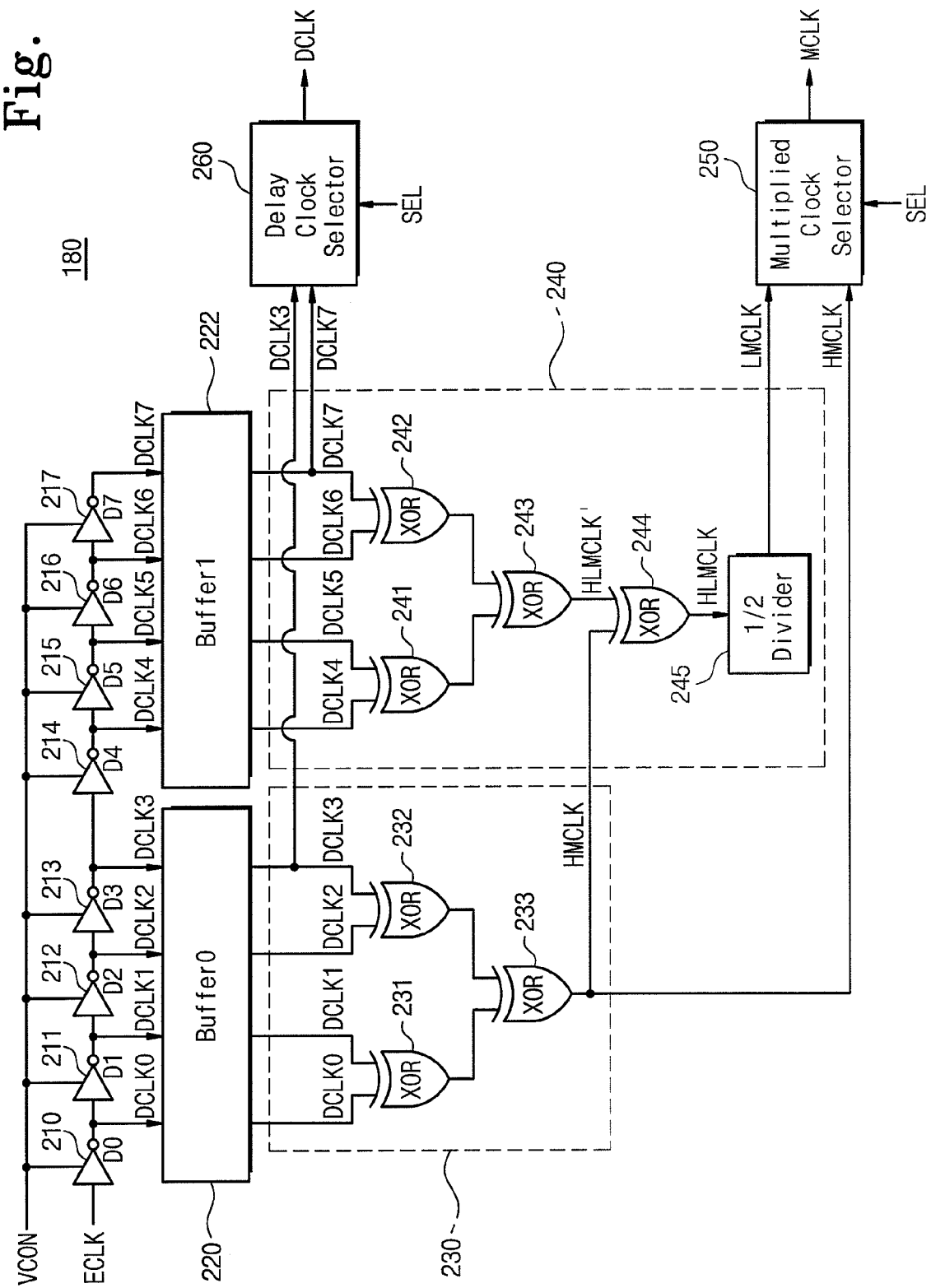
FIG. 5 is a circuit diagram of a voltage-controlled delay line according to an exemplary embodiment of the present invention.

FIG. 5 is a circuit diagram of the voltage-controlled delay line 180 according to an exemplary embodiment of the present invention. Referring to FIG. 5, the voltage-controller delay line 180 is comprised of delay cells 210, 211, 212, 213, 214, 215, 216, and 217, buffers 220 and 222, a first multiplied clock generator 230, a second multiplied clock generator 240, a multiplied clock selector 250, and a delay clock, or feedback clock, selector 260.

The delay cells 210~217 are connected in series, delaying the external clock signal ECLK by a delay time DT. In this exemplary embodiment, the delay cells control the clock delay time DT in response to the voltage signal VCON. As the voltage level of the voltage signal VCON becomes higher, the delay time DT becomes shorter. As the voltage level of the voltage signal VCON becomes lower, the delay time DT becomes longer. In general, if the external clock signal ECLK is shorter in cycle period, the voltage signal VCON is higher in level. If the external clock ECLK is longer in cycle period, the voltage signal VCON is lower in level.

Figure 6:
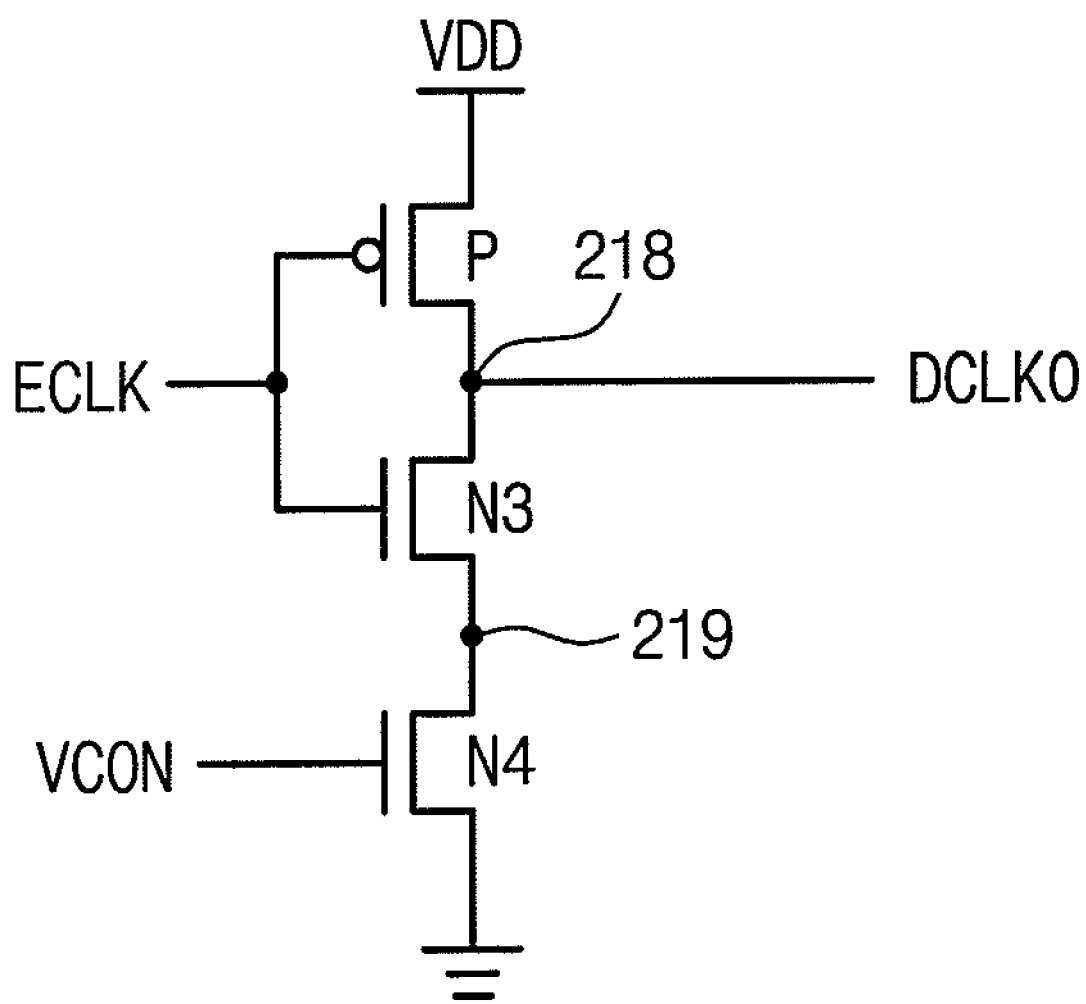
FIG. 6 is a circuit diagram of a delay cell employing an inverter.

The delay cells 210~217 may be formed of inverters. FIG. 6 is a circuit diagram of one delay cell, for example, 210, employing an inverter. Referring to FIG. 6, the delay cell 210 is composed of a PMOS transistor P and NMOS transistors N3 and N4. The PMOS transistor P has a source connected to the driving voltage VDD, a drain connected to a node 218, and a gate coupled to the external clock signal ECLK. The NMOS transistor N3 has a drain connected to the node 218, a source connected to a node 219, and a gate coupled to the external clock signal ECLK. The NMOS transistor N4 has a drain connected to the node 219, a source connected to the ground, and a gate coupled to the voltage signal VCON.

The delay cell 210 controls an amount of current flowing therein in response to the voltage signal VCON. The amount of current is involved in the delay time DT. In other words, the delay time DT is controlled by a voltage level of the voltage signal VCON.

For the convenience of description of FIG. 5, in this exemplary embodiment, eight delay cells are illustrated and a cycle period of the delay time DT is limited to ¼, that is, T/4, of the external clock signal ECLK. The delay cells 210~217 generate a plurality of delay clock signals DCLK0~DCLK7 derived from the external clock signal ECLK.

The buffers 220 and 222 temporarily store the delay clock signals DCLK0~DCLK7 generated each of the delay cells 210~217. The first buffer 220 receives the delay clock signals DCLK0~DCLK3. The delay clock signals DCLK0~DCLK3 applied to the first buffer 220 are used for a high-frequency operation of the voltage-controlled delay line 180 shown in FIG. 1. The second buffer 222 receives the delay clock signals DCLK4~DCLK7. The delay clock signals DCLK4~DCLK7 applied to the second buffer 222 are used for a low-frequency operation of the voltage-controlled delay line 180 shown in FIG. 1.

Figure 7:
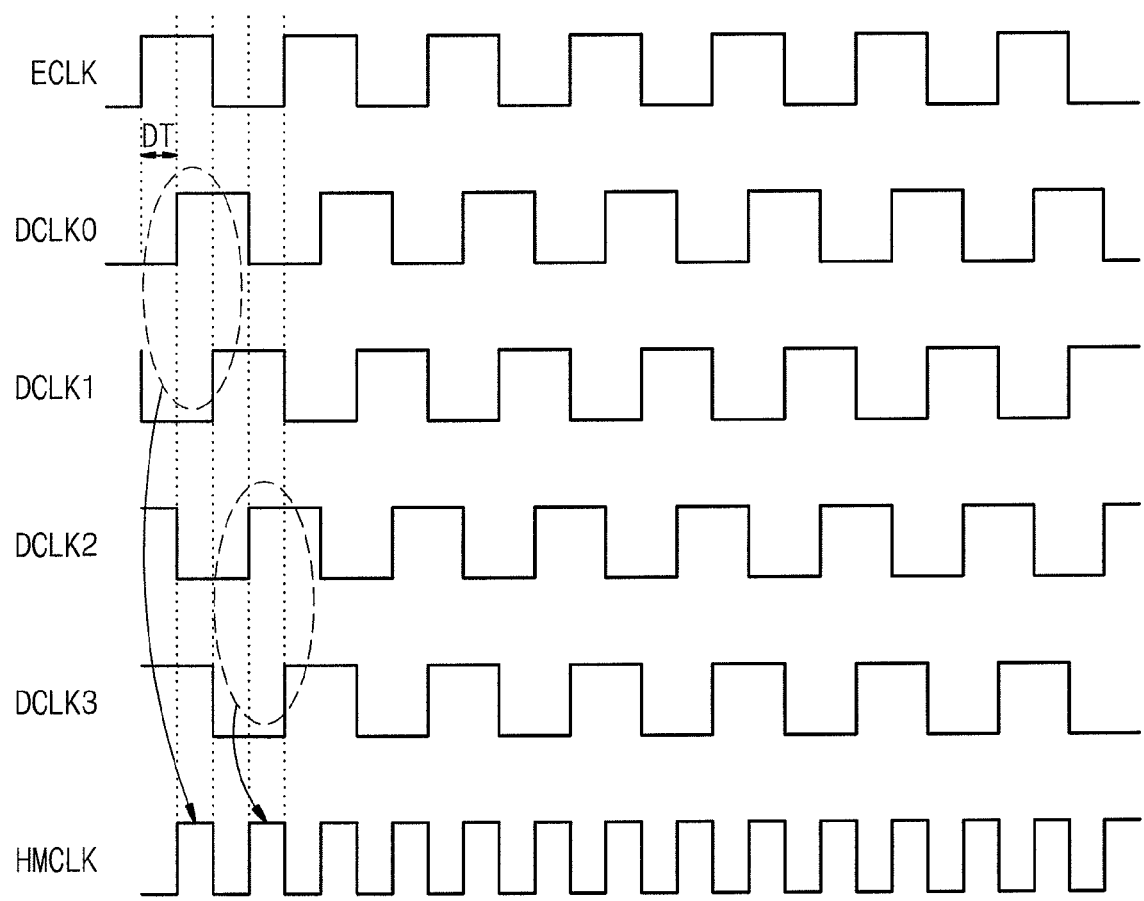
FIG. 7 is a timing diagram for generating a multiplied clock from the first multiplied clock generator of an exemplary embodiment of the present invention.

The first multiplied clock generator 230 generates a high-frequency multiplied clock signal HMCLK from the high-frequency delay clock signals DCLK0~DCLK3. The first multiplied clock generator 230 includes three XOR circuits 231, 232, and 233. The first XOR circuit 231 conducts an XOR operation with the delay clock signals DCLK0 and DCLK1. The second XOR circuit 232 conducts an XOR operation with the delay clock signals DCLK2 and DCLK3. The third XOR circuit 233 generates the high-frequency multiplied clock signal HMCLK by conducting an XOR operation with output values of the first and second XOR circuits 231 and 232. FIG. 7 is a timing diagram for generating the high-frequency multiplied clock signal HMCLK from the first multiplied clock generator 230 in this exemplary embodiment of the present invention. The first multiplied clock generator 230 according to this exemplary embodiment of the present invention generates the high-frequency multiplied clock signal HMCLK by means of the delay clock signals DCLK0~DCLK3. While FIG. 5 shows that the first multiplied clock generator 230 generates the high-frequency multiplied clock signal HMCLK by means of the three XOR circuits 231~233, other various combinations with other logical operation circuits are available for generating the high-frequency multiplied clock signal HMCLK.

The second multiplied clock generator 240 receives the delay clock signals DCLK4~DCLK7, which are specified for low frequency, and the high-frequency multiplied clock signal HMCLK of the first multiplied clock generator 230 and then generates a low-frequency multiplied clock signal LMCLK. Referring to FIG. 5, the second multiplied clock generator 240 includes four XOR circuits 241, 242, 243, and 244 and a frequency divider 245.

Figure 8:
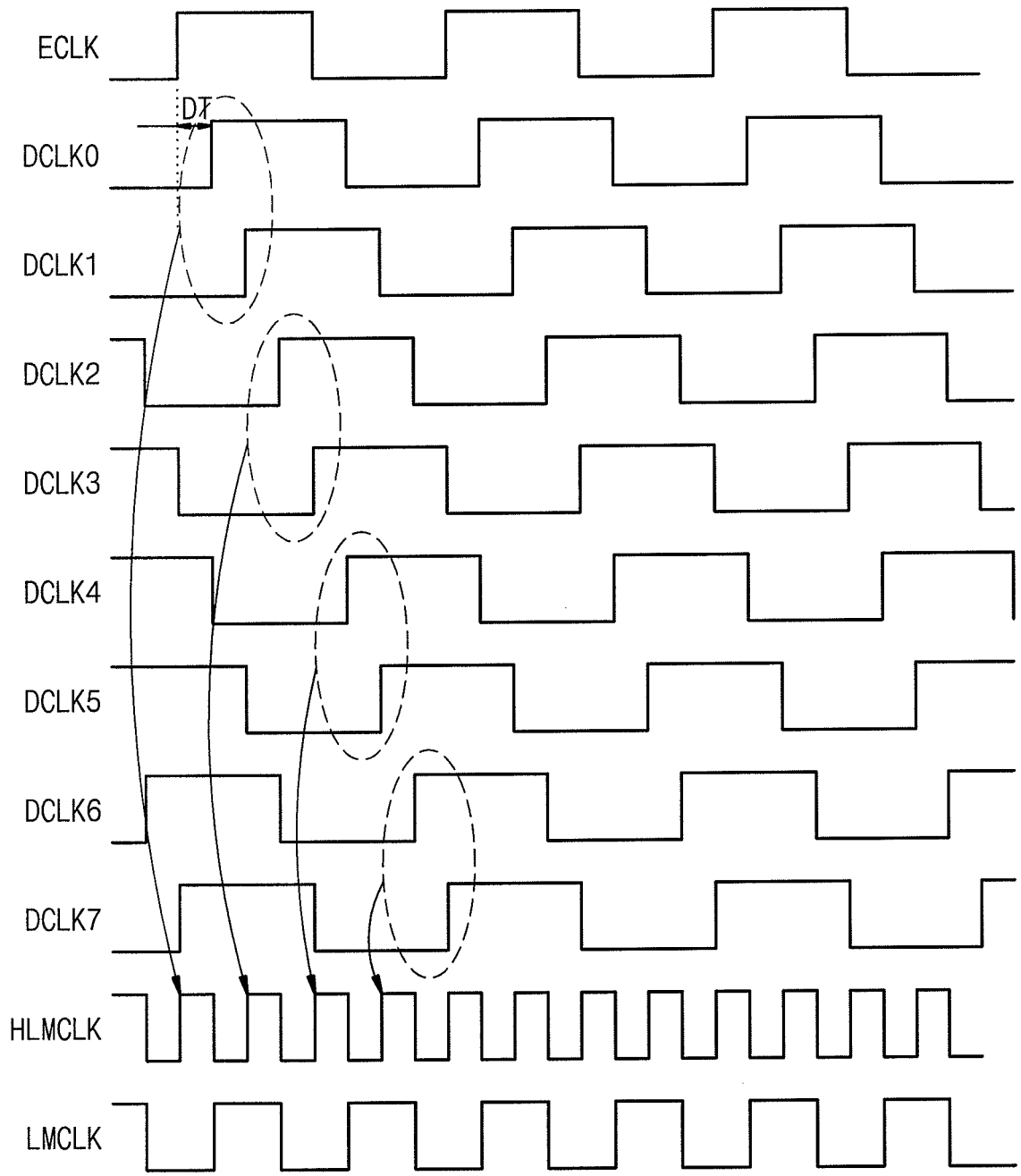
FIG. 8 is a timing diagram for generating a multiplied clock from the second multiplied clock generator of an exemplary embodiment of the present invention.

The fourth XOR circuit 241 executes an XOR operation with the delay clock signals DCLK4 and DCLK5. The fifth XOR circuit 242 executes an XOR operation with the delay clock signals DCLK6 and DCLK7. The sixth XOR circuit 243 generates a multiplied clock signal HLMCLK' by executing an XOR operation with the output values of the fourth and fifth XOR circuits 241 and 242. The seventh XOR circuit 244 generates a multiplied clock signal HLMCLK by executing an XOR operation with the output signals HLMCLK' and HMCLK of the sixth XOR circuit 243 and the first multiplied clock generator 230, respectively. The frequency divider 246 generates a low-frequency multiplied clock signal LMCLK by dividing by two the multiplied clock signal HLMCLK, which is transferred from the seventh XOR circuit 244. FIG. 8 is a timing diagram of the signals used for generating the multiplied clock signal LMCLK from the second multiplied clock generator 240 according to this exemplary embodiment of the present invention. The second multiplied clock generator 240 operates to generate the low-frequency multiplied clock signal LMCLK from the delay clock signals DCLK0~DCLK7. While FIG. 5 shows that the second multiplied clock generator 240 generates the low-frequency multiplied clock LMCLK by means of the four XOR circuits 241~244, other various combinations with other logical operation circuits are available for generating the low-frequency multiplied clock signal LMCLK.

Responding to the selection signal SEL, the multiplied clock selector 250 operates to select one signal, as the multiplied clock signal MCLK, from between the high-frequency multiplied clock signal HMCLK, which is transferred from the first multiplied clock generator 230, and the low-frequency multiplied clock signal LMCLK, which is transferred from the second multiplied clock generator 240. In this exemplary embodiment, the selection signal SEL is transferred from the frequency detector 160 shown in FIG. 1.

The delay clock selector 260 operates to select one signal as the delay clock signal DCLK from the two delay clock signals DCLK3 and DCLK7 in response to the selection signal SEL. In this exemplary embodiment, the selection signal SEL is transferred from the frequency detector 160 shown in FIG. 1.

The voltage-controlled delay line 180 according to an exemplary embodiment of the present invention generates the high and low-frequency multiplied clock signals HMCLK and LMCLK, respectively. The voltage-controlled delay line 180 selects the multiplied clock signal MCLK from the high and low-frequency multiplied clock signals HMCLK and LMCLK in accordance with a condition of the external clock signal ECLK.

The DLL circuit 100 shown in FIG. 1 according to an exemplary embodiment of the present invention operates in accordance with a result from the frequency detector 160 that determines whether the external clock signal ECLK has a high or low frequency. If the external clock signal ECLK operates at a high frequency, the voltage-controlled delay line 180 of the DLL circuit 100 generates the multiplied clock signal MCLK only from a half of the entire delay clock signals DCLK0~DCLK7. Otherwise, if the external clock signal ECLK operates at a low frequency, the voltage-controlled delay line 180 of the DLL circuit 100 generates the multiplied clock MCLK from all of the delay clock signals DCLK0~DCLK7. As can be seen from FIGS. 5 and 8, the DLL circuit 100 uses the same delay time DT regardless of whether the external clock signal ECLK operates at a low or high frequency. In this exemplary embodiment, the same delay time DT means that the same voltage signal VCON is utilized the DLL circuit 100 in both low and high frequency situations.

FIG. 9 is a graphic diagram showing level variations of the voltage signal VCON in response to the input frequency to the voltage-controlled delay line 180. In this exemplary embodiment, the input frequency is the frequency of the external clock signal ECLK. Referring to FIG. 9, in the conventional voltage-controlled delay circuit, the voltage signal becomes higher in voltage level as the input frequency goes higher. Furthermore, in the conventional voltage-controlled delay circuit, a voltage variation range must be as large as the input frequency variation in order to provide a wide frequency domain. Nonetheless, the voltage-controlled delay line 180 according to an exemplary embodiment of the present invention is able to extend an operating frequency domain wider than the conventional one even if there is a predetermined voltage variation with VL through VH on the reference frequency $f_r$, as shown in FIG. 9.

Whereas in FIG. 9, the voltage-controlled delay line 180 operates by dividing the frequency domain into two regions relative to the reference frequency $f_r$, it is not restrictive thereto. The voltage-controlled delay line 180 according to the exemplary embodiment of the present invention may be operable with a plurality of regions or frequency domains, for example, three or more regions or frequency domains.

FIG. 10 is a graphic diagram showing level variations of the voltage signal plotted against the input frequency in the voltage-controller delay line 180 operating with three frequency domains. Referring to FIG. 10, the conventional voltage-controlled delay circuit is unable to control the frequency above a frequency $f_{prior}$ by the voltage signal. Otherwise, the voltage-controlled delay line 180 according to the exemplary embodiment of the present invention is operable in the three frequency domains or regions on two reference frequencies $f_{r1}$ and $f_{r2}$. Thus, in the variation range of the voltage signal VCON, from VL to VH, the voltage-controlled delay circuit 180 is able to control the frequency up to a frequency $f_{present}$ higher than $f_{prior}$. The voltage-controlled delay line 180 extends its operating frequency domain within the variation range from VL to VH.

The DLL circuit 100 of FIG. 1 according to an exemplary embodiment of the present invention generates the multiplied clock signal MCLK by operating in accordance with the input frequency. According to this, the DLL circuit 100 is able to generate the multiplied clock signal MCLK to a wide bandwidth of the input frequency, even though the voltage signal VCON varies over a small range.

While the DLL circuit 100 according to an exemplary embodiment of the present invention is operable with the single reference frequency, it need not be restricted thereto. Namely, the DLL circuit 100 is able to generate the multiplied clock MCLK by operating in accordance with intervals by means of various reference frequencies.

The conventional DLL circuit has a problem of a narrow operating frequency domain because a variation range of the voltage signal becomes smaller as the driving voltage becomes lower. On the other hand, the DLL circuit 100 according to an exemplary embodiment of the present invention is operable in a wide operation frequency domain by differentiating operational patterns according to the input frequency, even when a variation range of the voltage signal VCON is smaller due to a low driving voltage.

Moreover, the DLL circuit 100 according to an exemplary embodiment of the present invention is helpful in improving noise characteristics, because it can operate in a high frequency mode in the same delay time with a low frequency mode.

As described above, the DLL circuit according to an exemplary embodiment of the present invention is able to operate in a wide operating frequency bandwidth by differentiating operations in accordance with the input frequency even when the voltage signal varies in a small range.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A delay-locked loop circuit comprising:
    a phase detector generating a detection signal by detecting a phase difference between an external clock signal and a feedback clock signal;
    a charge pump controlling a level of a voltage signal VCON in response to the detection signal;
    a frequency detector detecting the frequency domain of the external clock signal; and
    a voltage-controlled delay line generating a plurality of delay clock signals by delaying the external clock signal in response to the voltage signal and generating a multiplied clock signal by means of the delay clock signals in different numbers in accordance with a frequency domain of the external clock signal,
    wherein the voltage-controlled delay line operates by dividing the detected frequency domain into two or more frequency domains relative to reference frequencies, and
    wherein the multiplied clock signal is generated by multiplying the external clock signal an integer number of times and wherein the feedback clock signal is delayed from the plurality delay clock signals by a cycle period of the external clock signal,
    wherein the detection signal of the phase detector includes up and down signals,
    wherein the voltage-controlled delay line generates the plurality of delay clock signals using a plurality of delay cells,
    wherein the voltage-controlled delay line comprises 2m delay cells (m is a positive integer), sequentially generates 2m delay clock signals with predetermined delay times each through a respective one of the plurality of delay cells, and determines to generate the multiplied clock signal by means of m delay clock signals or 2m delay clock signals, according to a delayed sequence, in response to a selection signal,
    wherein the m delay clock signals are used when the external clock signal has a high frequency, and 2m delay clock signals are used when the external clock signal has a low frequency, as determined by the frequency detector,
    wherein the voltage-controlled delay line comprises:
    a first multiplied clock generator operating to generate a first multiplied clock signal by means of the m-numbered delay clock signals sequentially delayed from the external clock;
    a second multiplied clock generator operating to generate a second multiplied clock signal by means of the 2m-numbered delay clock signals; and
    a multiplied clock selector operating to select one of the first and second multiplied clock signals in response to the selection signal.

2. The delay-locked loop circuit as set forth in claim 1, wherein the voltage-controlled delay line further comprises: a plurality of buffers temporarily storing the 2m-numbered delay clock signals,
    wherein the delay clock signals stored in the plurality of buffers are transferred to the first and second multiplied clock generators.

3. The delay-locked loop circuit as set forth in claim 1, wherein the first and second multiplied clock generators operate to generate the second multiplied clock signal that is a half of the external clock signal in cycle period.

4. The delay-locked loop circuit as set forth in claim 3, wherein m is 4 and the delay clock signals are generated from a first to an eighth in sequence.

5. The delay-locked loop circuit as set forth in claim 4, wherein the first multiplied clock generator comprises:
    a first logic circuit executing an XOR operation with a first and second delay clock signals;
    a second logic circuit executing an XOR operation with a third and fourth delay clock signals; and
    a third logic circuit generating the first multiplied clock signal by executing an XOR operation with output values of the first and second logic circuits.

6. The delay-locked loop circuit as set forth in claim 5, wherein the second multiplied clock generator comprises:

a fourth logic circuit executing an XOR operation with a fifth and sixth delay clock signals;

a fifth logic circuit executing an XOR operation with a seventh and eighth clock signals;

a sixth logic circuit executing an XOR operation with output values of the fourth and fifth logic circuits;

a seventh logic circuit executing an XOR operation with output values of the first multiplied clock generator and the sixth logic circuit; and a frequency divider generating the second multiplied clock signal by dividing an output value of the seventh logic circuit in half.

7. The delay-locked loop circuit as set forth in claim 4, wherein the voltage-controlled delay line further comprises: a feedback clock selector operating to select one from the fourth and eighth delay clock signals in response to the selection signal.

\* \* \* \* \*